(12) United States Patent
Ji et al.

(10) Patent No.: US 10,667,028 B2
(45) Date of Patent: May 26, 2020

(54) ELECTRIC DEVICE INCLUDING MICROSPEAKER MODULE WITH VIBRATION FUNCTION AND WEARABLE ACOUSTIC TRANSDUCER

(71) Applicant: EM-TECH. Co., Ltd., Busan (KR)

(72) Inventors: Yong Ju Ji, Gyeongsangnam-do (KR); Joong Hak Kwon, Gyeongsangnam-do (KR)

(73) Assignee: EM-TECH. Co., Ltd., Busan (KR)

(*) Notice: Subject to any disclaimer, the term of this patent is extended or adjusted under 35 U.S.C. 154(b) by 32 days.

(21) Appl. No.: 15/961,056

(22) Filed: Apr. 24, 2018

(65) Prior Publication Data

US 2018/0242060 A1 Aug. 23, 2018

Related U.S. Application Data

(63) Continuation-in-part of application No. 14/963,955, filed on Dec. 9, 2015, now abandoned.

(51) Int. Cl.
*H02B 1/00* (2006.01)
*H04R 1/02* (2006.01)
(Continued)

(52) U.S. Cl.
CPC .............. *H04R 1/025* (2013.01); *H03G 3/301* (2013.01); *H03G 5/005* (2013.01); *H03G 5/165* (2013.01);
(Continued)

(58) Field of Classification Search
CPC .......... H04R 1/025; H04R 7/16; H04R 1/028; H04R 3/00; H04R 2400/03; H04R 1/1058;
(Continued)

(56) References Cited

U.S. PATENT DOCUMENTS 6,857,501 B1   2/2005   Han et al.
8,019,108 B2   9/2011   Hayashi
(Continued)

FOREIGN PATENT DOCUMENTS

KR   1020100042178 A   4/2010
KR   1020130020467 A   2/2013
(Continued)

OTHER PUBLICATIONS

Kwon, O.D. et al., "A Research on the Piezoelectric Vibration Actuator for Mobile Phone", Proceedings of 2005 International Symposium on Electrical Insulating Materials, Kitakyushu, Japan, Jun. 5-9, 2005, pp. 676-678.

*Primary Examiner* — Ammar T Hamid
(74) *Attorney, Agent, or Firm* — Murphy, Bilak & Homiller, PLLC

(57) ABSTRACT

A wearable acoustic transducer includes a communication part for performing communication and speaker and control modules. The speaker module includes an enclosure having an inner space, a first opening in which a speaker part is mounted being formed in a first side surface thereof, a second opening in which a passive vibration part is mounted being formed in a second side surface thereof, the speaker part configured to emit sound, and a passive vibration part for relieving air stiffness in the inner space of the enclosure. The control module performs gain correction on an electric signal including sound or voice that is received from the communication part according to prestored gain correction data and applies the gain-corrected electric signal to the speaker part, or generates an electric signal corresponding to the gain correction data and applies the electric signal to the speaker part.

14 Claims, 11 Drawing Sheets

(51) Int. Cl.
  *H04R 7/16* (2006.01)
  *H03G 3/30* (2006.01)
  *H03G 5/16* (2006.01)
  *H03G 5/00* (2006.01)
  *H04R 25/00* (2006.01)
  *H04R 1/28* (2006.01)
  *H04R 3/04* (2006.01)
  *H04R 9/06* (2006.01)
  *H04R 9/02* (2006.01)
  *H04R 5/033* (2006.01)
  *H04R 1/10* (2006.01)
  *H04R 31/00* (2006.01)
  *H04R 3/12* (2006.01)

(52) U.S. Cl.
  CPC ............. *H04R 7/16* (2013.01); *H04R 1/1058* (2013.01); *H04R 1/2834* (2013.01); *H04R 3/04* (2013.01); *H04R 3/12* (2013.01); *H04R 5/0335* (2013.01); *H04R 9/025* (2013.01); *H04R 9/06* (2013.01); *H04R 31/006* (2013.01); *H04R 2201/107* (2013.01); *H04R 2400/03* (2013.01); *H04R 2499/11* (2013.01)

(58) Field of Classification Search
  CPC ........ H04R 1/2834; H04R 1/283; H04R 3/04; H04R 3/12; H04R 5/0335; H04R 9/025; H04R 9/06; H04R 2201/107; H04R 2499/11; H03G 3/301; H03G 5/005; H03G 5/165
  USPC .......................................... 381/123, 104–109
  See application file for complete search history.

(56) References Cited

U.S. PATENT DOCUMENTS

| | | |
|---|---|---|
| 8,755,844 B2 | 6/2014 | Lee et al. |
| 2015/0010175 A1 | 1/2015 | Porter et al. |
| 2015/0110329 A1 | 4/2015 | Tanaka |
| 2015/0230019 A1* | 8/2015 | Sakai ................... H04R 1/1041 381/74 |
| 2015/0237441 A1* | 8/2015 | Muramatsu .............. H04R 3/12 381/120 |
| 2016/0286305 A1* | 9/2016 | Hou ........................ H04R 3/08 |
| 2017/0006382 A1 | 1/2017 | Luzzato et al. |

FOREIGN PATENT DOCUMENTS

| | | |
|---|---|---|
| KR | 101361477 B1 | 6/2014 |
| KR | 101407490 B1 | 6/2014 |

* cited by examiner

MICROSPEAKER
SIGNAL INPUT UNIT

VIBRATION
MOTOR SIGNAL
INPUT UNIT

MICROSPEAKER
SIGNAL INPUT UNIT

ELECTRIC DEVICE INCLUDING MICROSPEAKER MODULE WITH VIBRATION FUNCTION AND WEARABLE ACOUSTIC TRANSDUCER

TECHNICAL FIELD

The present invention relates to an electric device including a microspeaker module with a vibration function and, more particularly, to an electric device including a microspeaker module with both a vibration function and a sound emission (sound reproduction) function.

BACKGROUND

A microspeaker module is a device for generating vibration of air by an electric signal and reproducing the generated vibration as a sound. As illustrated in FIG. 1, the microspeaker module with a vibration function generally has a shape of rectangular parallelepiped and includes an enclosure 1 serving as a sound box generating sound pressure therein, a microspeaker 2 installed on an upper surface of the enclosure 1 and changing an electrical signal into acoustic pressure to generate vibration of air, and a vibration motor 4 installed within the enclosure 1.

The enclosure 1, a part forming an overall external appearance of the microspeaker module, generally has a shape of a rectangular parallelepiped and has an opening 3 provided on an upper surface thereof to allow the microspeaker 2 to be installed therein.

The vibration module 4 performs a vibration function in response to an electric signal from an electric device.

In case of a general microspeaker module, a magnitude of a back volume of a device in which the microspeaker module is installed significantly affects sound characteristics of the microspeaker module. According to Helmholtz Equation for resonance, a back volume greatly affects equivalent stiffness of air, and thus, as the back volume is smaller, equivalent stiffness is increased to lower sound pressure of a low band and increase a first order resonance frequency.

In particular, in an electric device such as a smartphone or a tablet PC, a microspeaker module takes a small space, considerably reducing a back volume, causing sound pressure to be further lowered in a low band.

In addition, when a vibration motor 4 is installed within the enclosure 1, the back volume is considerably reduced, and as illustrated in FIG. 2, in addition to a signal input unit toward the microspeaker 2, a signal input unit toward the vibration motor 2 needs to be provided, causing a problem in that it is not easy to lead these signal input units to outside when assembling the enclosure 1.

SUMMARY

An object of the present invention is to provide an electric device including a microspeaker module with a vibration function, capable of solving a limitation in reproducing a sound due to limited capacity (installation space) and performing a vibration function even without a vibration motor.

An object of the present invention is to provide a wearable acoustic transducer which includes a speaker part for generating a sound pressure in response to an electric signal to generate vibration of the air and a passive vibration part vibrating in response to the vibration of the air generated by the speaker part without the supply of the electric signal and thus regulates the proportion of sound and vibration by controlling a frequency characteristic of the electric signal to be applied to the speaker part.

According to an aspect of the present invention for achieving the above object, there is provided a wearable acoustic transducer, comprising: a communication part for performing communication with the telecommunication equipment; a speaker module including an enclosure having an inner space, a first opening in which a speaker part is mounted being formed in a first side surface thereof, a second opening in which a passive vibration part is mounted being formed in a second side surface thereof, the speaker part for emitting sound by an electric signal from a control module, and a passive vibration part for relieving the air stiffness in the inner space of the enclosure; and the control module for performing gain correction on an electric signal including sound or voice that is received from the communication part according to the prestored gain correction data and applying the gain-corrected electric signal to the speaker part, or for generating an electric signal corresponding to the gain correction data and applying the electric signal to the speaker part.

In some embodiments, the natural frequency of the speaker part is higher than the natural frequency of the passive vibration part, and the speaker part mounted in the enclosure vibrates with a first vibration amplitude maximum value in a frequency lower than the natural frequency of the passive vibration part and with a second vibration amplitude maximum value in the natural frequency of the speaker part.

In some embodiments, preferably, the control module processes the received electric signal according to the gain correction data causing the vibration amplitude of the speaker part to be within the maximum allowable displacement or the maximum allowable displacement range of the vibration amplitude.

In some embodiments, preferably, the control module performs gain attenuation correction on an electric signal in a frequency range that includes a frequency causing the first vibration amplitude maximum value and that causes a vibration amplitude exceeding the maximum allowable displacement or the maximum allowable displacement range of the vibration amplitude, according to the gain correction data.

In some embodiments, preferably, the natural frequency of the speaker part is higher than the natural frequency of the passive vibration part, and the control module stores a cutoff frequency between the natural frequency of the passive vibration part and the natural frequency of the speaker part.

In some embodiments, preferably, the control module performs one or more of a vibration mode, a sound priority mode, and a vibration-sound combination mode including the vibration mode and the sound priority mode.

According to the present invention, the wearable acoustic transducer includes the speaker part for generating the sound pressure in response to the electric signal to generate vibration of the air and the passive vibration part vibrating in response to the vibration of the air generated by the speaker part without the supply of the electric signal and thus regulates the proportion of sound and vibration by controlling the frequency characteristic of the electric signal to be applied to the speaker part.

According to an embodiment of the present invention, a limitation in reproducing a sound due to limited capacity (installation space) within an electric device may be solved, a vibration function may be performed even without a vibration motor, and an intrinsic sound emission function may be performed.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Hereinafter, embodiments of the present invention will be described with reference to the accompanying drawings.

Figure 1:
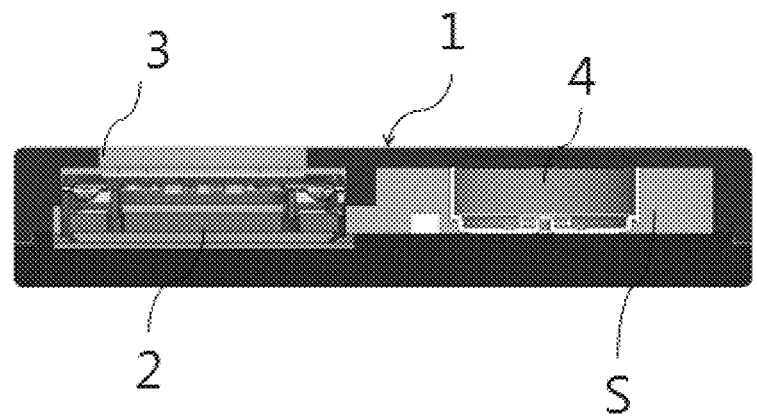
FIG. 1 is a cross-sectional view of a microspeaker module according to a related art.
Figure 2:
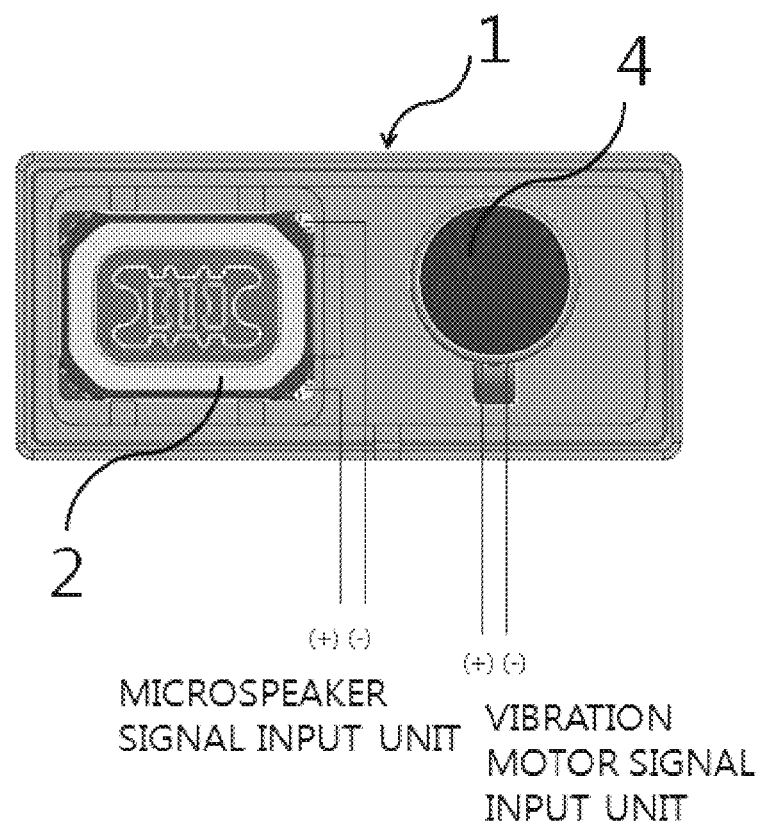
FIG. 2 is a plan view of the microspeaker of FIG. 1.
Figure 3:
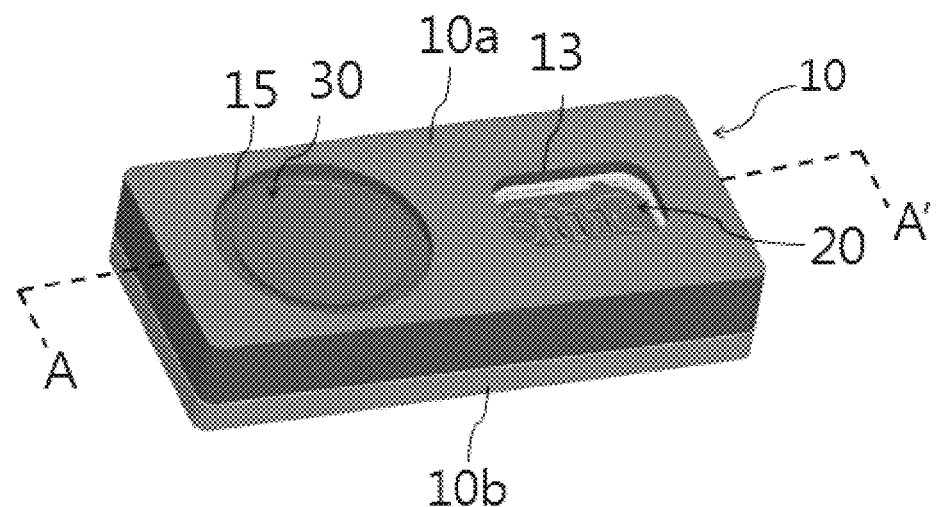
FIG. 3 is a perspective view of a microspeaker module having a subordinate vibration unit according to an embodiment of the present invention.
Figure 4:
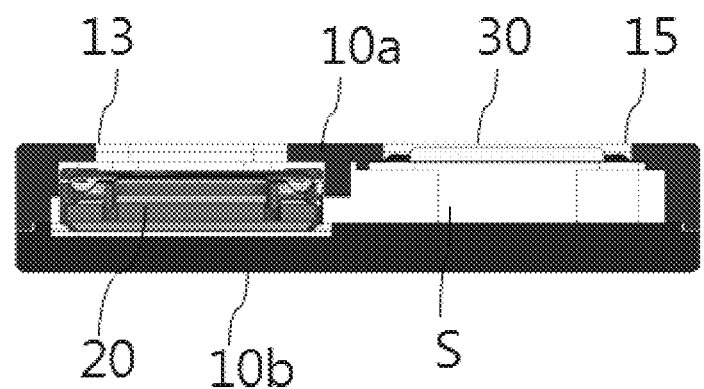
FIG. 4 is a schematic cross-sectional view of the microspeaker module of FIG. 3.
Figure 5:
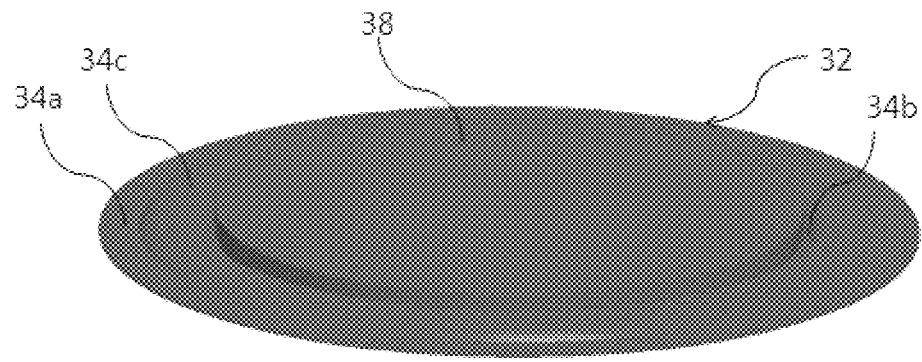
FIG. 5 is a detailed perspective view of the subordinate vibration unit of FIG. 3.

FIG. 3 is a perspective view of a microspeaker module having a subordinate vibration unit according to an embodiment of the present invention, FIG. 4 is a schematic cross-sectional view of the microspeaker module of FIG. 3, taken along line A-A' of FIG. 3, and FIG. 5 is a detailed perspective view of the subordinate vibration unit of FIG. 3.

As illustrated in FIG. 3, the microspeaker module includes an enclosure 10 having a shape of a rectangular parallelepiped and serving as a sound box generating sound pressure therein, a microspeaker 20 installed on an upper surface of the enclosure 10 and changing an electrical signal into sound pressure to generate vibration of air, and a subordinate vibration unit 30 alleviating stiffness of air within the enclosure 10 and vibrating.

The enclosure 10, which is a part forming an overall outer appearance of the microspeaker module, includes an upper part 10a and a lower part 10b. A first opening 13 allowing a microspeaker 20 to be installed therein and a second opening 15 allowing the subordinate vibration unit 30 to be installed therein are provided on an upper surface of the upper part 10a. A grill (not shown) may be installed above the first and second openings 13 and 15.

The microspeaker 20 is a technique of a level that may be recognized by a person skilled in the art to which the present invention pertains, so a description thereof will be omitted. The microspeaker 20 is installed on a lower surface of the upper part 10a to correspond to a position of the first opening 13 within the enclosure 10 to emit a sound through the first opening 13.

The subordinate vibration unit 30, having predetermined mass and stiffness, is a component free from power or supply of an electric signal. The subordinate vibration unit 30 is installed in a lower surface of the upper part 10a to correspond to a position of the second opening 15 within the enclosure to emit a sound through the second opening 15. As illustrated in FIG. 4, a thickness of the subordinate vibration unit 30 is smaller than that of the microspeaker 10 to prevent a reduction in the volume of an internal space S.

As illustrated in FIG. 5, the subordinate vibration unit 30 includes a vibration plate 32 composed of an installation portion 34a attached to a lower surface of the upper part 10a, a central portion 34b on which a main body portion 38 is installed, and a dome portion 34c connecting the installation portion 34a and the central portion 34b. The main body portion 38 is formed of an iron, copper, or tungsten-based metal having high specific gravity to increase weight of the vibration plate 32.

The main body portion 38 is attached to the central portion 34b, and an opening may be formed at the center of the central portion 34b.

The subordinate vibration unit 30 is installed in the upper part 10a such that the dome portion 34c and the main body portion 38 are positioned within the second opening 15 without protruding from an upper surface of the upper part 10a even when the subordinate vibration unit 30 has maximum amplitude.

Figure 6:
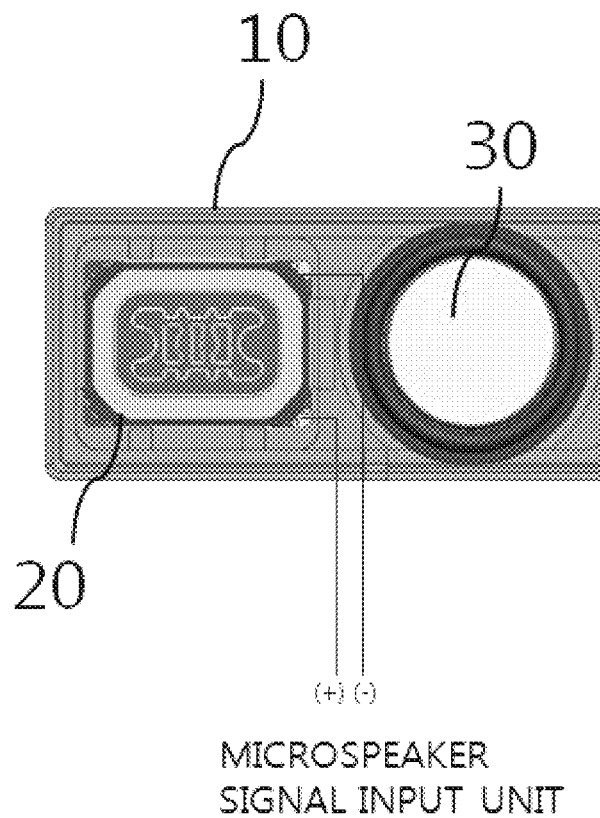
FIG. 6 is a plan view of the microspeaker of FIG. 3.

FIG. 6 is a plan view of the microspeaker of FIG. 3. As illustrated in FIG. 6, the microspeaker 20 includes a signal input unit receiving an electric signal from a control unit (illustrated in FIG. 7) of the electric device, and performs a vibration function and a sound emission (sound reproduction) function only with an electric signal applied through the signal input unit.

Figure 7:
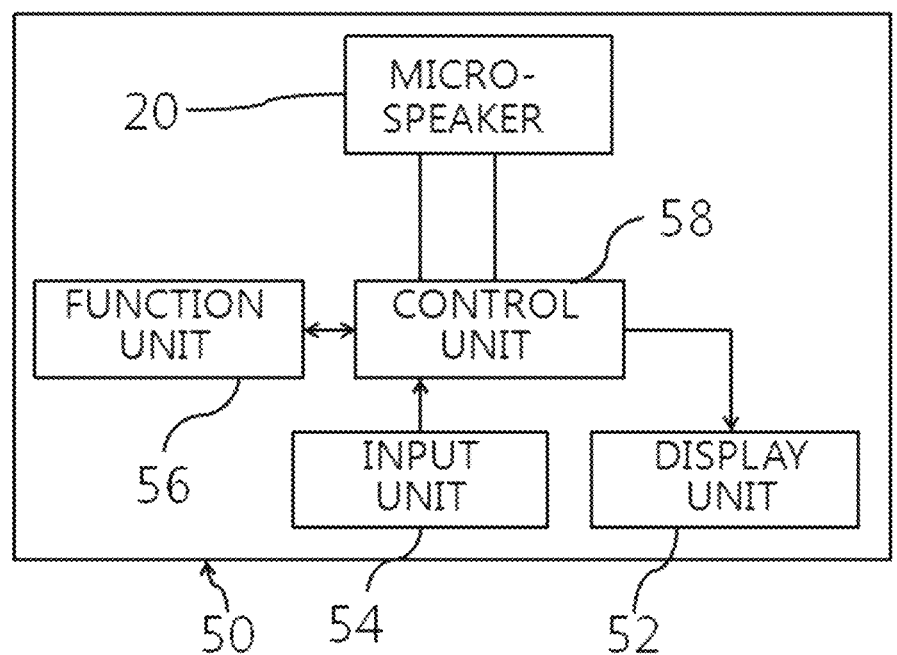
FIG. 7 is a block diagram of an electric device including the microspeaker of FIG. 3.

FIG. 7 is a block diagram of an electric device 50 including the microspeaker of FIG. 3. The electric device 50 includes a microspeaker 20, a display unit 52 displaying various types of information, an input unit 54 obtaining an input from a user, a function unit 56 performing an intrinsic function (for example, a communication function, a music reproduction function (or music playback function), a movie reproduction function, and a PC function) of the electric device 50, and a control unit 58 controlling the microspeaker 20, the display unit 52, the input unit 54, and the function unit 56. Here, a power supply unit (not shown), the display unit 52, the input unit 54, and the function unit 56 are techniques familiar to a person skilled in the art to which the present invention pertains, so a description thereof will be omitted.

The function unit 56 may include any one among a communication module (for example, bluetooth chip, LTE chip and so on) and multimedia player (for example, mp3 player, mp4 player, movie player and so on) of the electric device 50.

In a case in which a vibration mode is set on the basis of current mode setting (vibration mode, sound reproduction mode), the control unit 58 generates a vibration electric signal including a vibration frequency region (for example, 150 Hz to 250 Hz) including a resonance frequency Df of the subordinate vibration unit 30 and applies the generated vibration electric signal to the microspeaker 20 for a vibration function of the microspeaker 20. Thus, the microspeaker 20 performs an operation. However, in the vibration frequency region, a reproduction sound pressure is very low and the vibration mode is conducted in a state in which vibration of the subordinate vibration unit 30 works considerably. The subordinate vibration unit 30 performs vibration immediately after an operation of the microspeaker 20, so a response speed is high.

The control unit 58 includes at least one data processor (for example, a microprocessor, CPU, etc.) to process data, signals, external sound and user inputs to control the aforementioned components of the electric device 50. For example, the control unit 58 controls the microspeaker 20 using the foregoing vibration electric signal, when a vibration function is required, while performing an intrinsic function.

Figure 8:
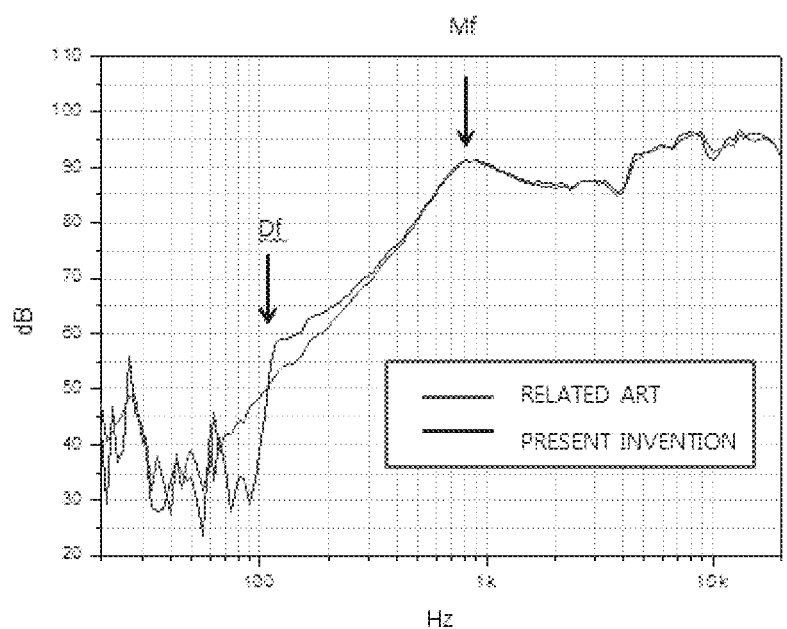
FIG. 8 is a graph illustrating sound pressure characteristics of the present invention and the related art.

FIG. 8 is a graph illustrating sound pressure characteristics according to the present invention and the related art. As illustrated in FIG. 8, in the sound pressure characteristics graph of the microspeaker module according to the related art and the sound pressure characteristics graph of the microspeaker module having the subordinate vibration unit according to the present invention, it can be seen that the sound pressure characteristics are the same in the frequency region of about 400 Hz but the sound pressure characteristics (vibration) of the present invention is better in a low frequency band ranging from about 150 Hz to 400 Hz. In order to enhance the sound pressure characteristics (vibration) in the low frequency band, a resonance frequency DI of the subordinate vibration unit 30 needs to be lower than the resonance frequency Mf of the microspeaker 20. That is, the resonance frequency Df of the subordinate vibration unit 30 is set to range from about 150 Hz to 250 Hz to enhance vibration characteristics of the present invention.

Figure 9A:
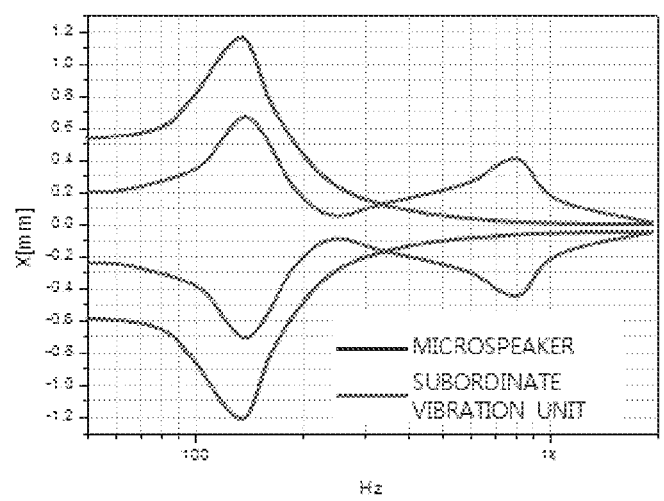
FIGS. 9A and 9B are graphs illustrating sound pressure characteristics of the subordinate vibration unit and a microspeaker.
Figure 9B:
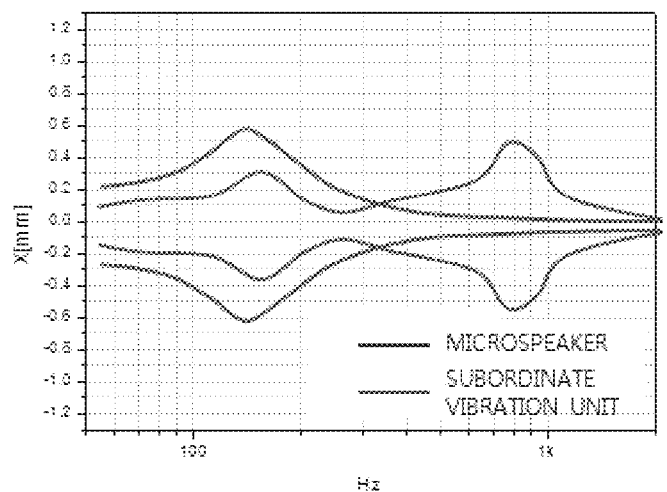

FIGS. 9A and 9B are sound pressure characteristics of the subordinate vibration unit and the microspeaker. FIG. 9A illustrates a case in which stiffness of the subordinate vibration unit 30 is lower than that of the microspeaker 20 (vibration plate) and FIG. 9B illustrates a case in which stiffness of the subordinate vibration unit 30 is higher than that of the microspeaker 20 (vibration plate).

In FIG. 9A, when stiffness of the subordinate vibration unit 30 is low, an amplitude of the microspeaker 30 is increased in the resonance frequency Df of the subordinate vibration unit 30, causing the vibration plate of the microspeaker 30 to be brought into contact with a yoke, a magnet, or a protector therein.

As illustrated in FIG. 9B, stiffness of the subordinate vibration unit 30 is increased and a weight is increased by the main body portion 38, whereby an excessive increase in the amplitude of the microspeaker 20 is prevented in the resonance frequency Df and sound pressure (vibration) in the low band frequency region is enhanced.

Figure 10:
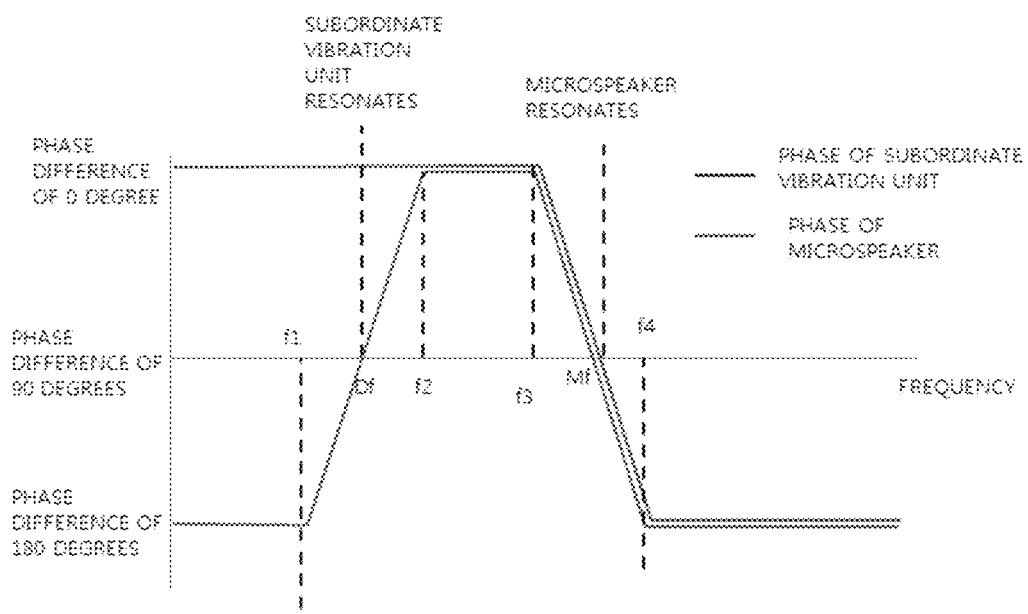
FIG. 10 is a graph illustrating phase characteristics of the subordinate vibration unit and the microspeaker.

FIG. 10 is a phase characteristics graph of the subordinate vibration unit and the microspeaker. As illustrated, a difference between a phase of the microspeaker 20 and a phase of an electric signal input to the microspeaker 20 before the microspeaker 20 resonates is 0. The phase of the microspeaker 20 is increased from a frequency f3, and a phase difference is 90 degrees when the microspeaker 20 resonates. Thereafter, the phase difference is further increased to reach 180 degrees at a frequency f4 or after and maintained thusly.

In the case of the subordinate vibration unit 30, a phase difference of 180 degrees is made with respect to an input electric signal until a frequency f1 before the subordinate vibration unit 30 resonates. The phase difference is reduced from the frequency f1 to reach 90 degrees in the resonance frequency Df. The phase difference continues to be reduced and overlaps the phase characteristics graph of the microspeaker 20 at a frequency f2 and the same as the phase difference graph of the microspeaker 20 thereafter. As illustrated in FIG. 9B, although the vibration displacement (amplitude) of the subordinate vibration unit 30 is relatively reduced, an area of the subordinate vibration unit 30 (vibration plate 32) is increased to be greater than that of the vibration plate of the microspeaker 20 to increase a sound pressure compensation effect (vibration) in the low frequency band.

In particular, when the control unit 58 of the electric device 50 applies an electric signal having the resonance frequency Df of the subordinate vibration unit 30 to the microspeaker 20, the subordinate vibration unit 30 vibrates with a maximum amplitude in the resonance frequency Df, and since a phase difference between the subordinate vibration unit 30 and the microspeaker 20 is 90 degrees, a partial amount of sound is cancel out, and thus, vibration works more greatly than sound emission. In particular, since a reproduction sound pressure of the microspeaker 20 is remarkably low in a frequency ranging from 150 to 250 Hz, vibration of the subordinate vibration unit 30 works relatively greatly, whereby the microspeaker module performs the vibration function.

Figure 11A:
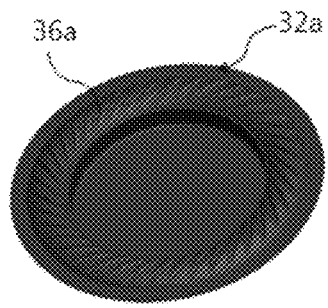
FIGS. 11A and 11B are views illustrating various examples of vibration plates of a subordinate vibration unit.
Figure 11B:
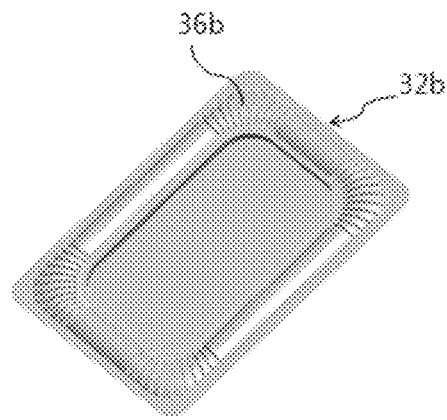

FIGS. 11A and 11B are views illustrating various examples of vibration plates of the subordinate vibration unit 30. As illustrated in FIG. 11A, the subordinate vibration unit 30 includes a circular vibration plate 32*a* and has a comb-pattern structure 36*a* in a dome portion thereof. The vibration plate 32*a* vibrates up and down linearly, minimizing partial vibration.

As illustrated in FIG. 11B, the subordinate vibration unit 30 includes a rectangular vibration plate 32*b* and has a comb-pattern structure 36*b* in a dome portion thereof. The vibration plate 32*a* vibrates up and down linearly, minimizing partial vibration.

Figure 12:
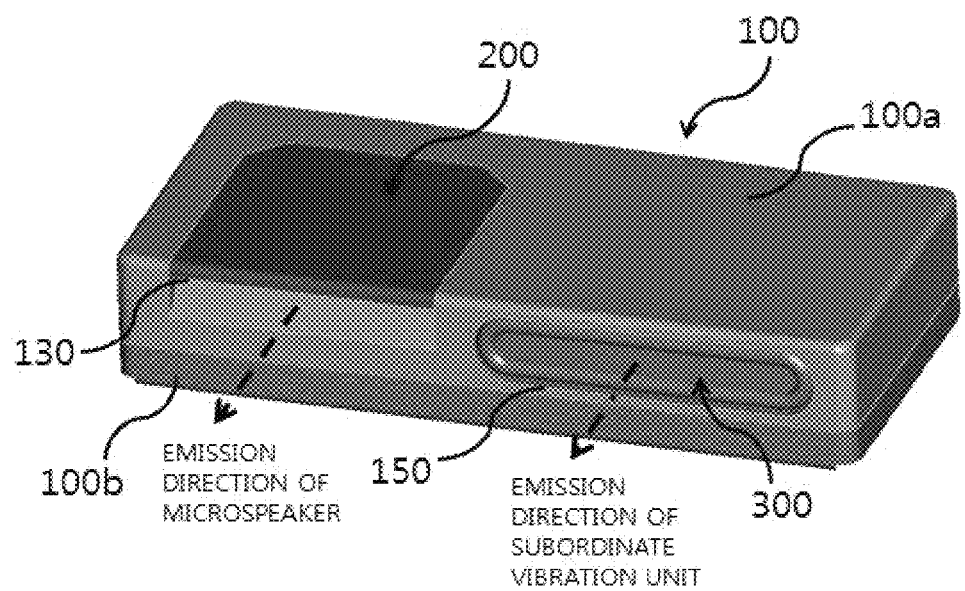
FIG. 12 is a view illustrating a microspeaker module according to another embodiment of the present invention.

FIG. 12 is a view illustrating a microspeaker module according to another embodiment of the present invention. Unlike the embodiment of FIG. 3, the microspeaker module includes an enclosure 100 including an upper layer part 100*a* and a lower layer part 100*b* coupled to the upper layer part 100*a* to form a space therein, a microspeaker 200 emitting a sound through a first opening 130 formed on an upper surface and a side surface of the upper layer part 100*a*, and a subordinate vibration unit 300 emitting a sound through a second opening 150 formed on a side surface of the upper layer part 100a. That is, sound emission directions of the microspeaker 200 and the subordinate vibration unit 300 are lateral directions.

Figure 13:
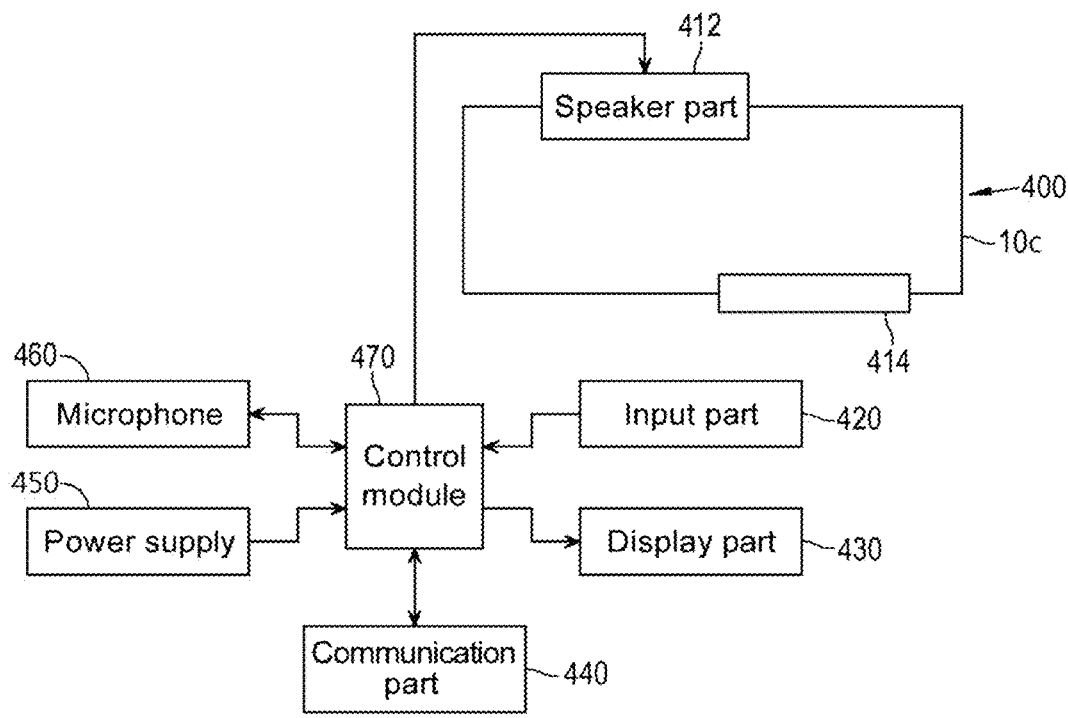
FIG. 13 is a configuration view of a wearable acoustic transducer according to the present invention.

FIG. 13 is a configuration view of the wearable acoustic transducer according to the present invention.

The wearable acoustic transducer according to the present invention includes a speaker module 400 for performing a sound emission function and a vibration emission function, an input part 420 for acquiring an input from a user, a display part 430 for displaying information such as a power state, operational state, etc., a communication part 440 for performing wired or wireless communication (for example, bluetooth communication and so on) with the telecommunication equipment (for example, a smartphone, a tablet PC, etc.), a power supply 450 for supplying necessary power, a microphone 460 for acquiring external sound, and a control module 470 for controlling the aforementioned components to perform a sound source emission mode that receives encoded sound source data from the telecommunication equipment and emits sound through the speaker module 400, a phone call mode and a vibration combination mode according to the preset mode. However, the display part 430, the communication part 440, the power supply 450 and the microphone 460 have been well-known to those skilled in the art, and thus a detailed explanation thereof will be omitted.

First, the speaker module 400 is composed of a speaker part 412 mounted on one side surface (opening) of an enclosure 200a and supplied with an electric signal from the control module 470 to generate a sound pressure to generate vibration of the air, the enclosure 10c being formed in a three-dimensional shape, having an empty space therein and serving as a sound chamber, and a passive vibration part 414 mounted on the other side surface (opening) of the enclosure 10c to relieve the air stiffness in the enclosure 10c and vibrating without the application of the electric signal from the control module 470.

The speaker part 412 can be easily recognized by those skilled in the art, such as a microspeaker, and thus a detailed explanation thereof will be omitted. The speaker part 412 includes at least a diaphragm, a coil part mounted on the bottom surface of the diaphragm, and a frame for supporting the diaphragm. The speaker part 412 is mounted in the enclosure 10c to emit sound through the opening formed in one side surface of the enclosure 10c.

The passive vibration part 414 has a certain mass and stiffness and vibrates without the supply of the electric signal from the control module 470. The passive vibration part 414 is mounted on the other side surface of the enclosure 10c to emit sound through the opening formed in the other side surface of the enclosure 10c. The passive vibration part 414 may be composed of a dome-shaped diaphragm, and a metal material such as iron, copper and tungsten with a high specific gravity may be stacked or coated on the diaphragm to increase a mass. In order to improve a vibration characteristic that is a sound pressure characteristic in a low frequency band, the passive vibration part 414 is manufactured to have a lower natural frequency than that of the speaker part 412.

The input part 420 acquires a user input such as, e.g., power on/off, volume up/down, music selection/movement, mode selection (vibration mode/sound priority mode/vibration-sound combination mode in call reception, vibration combination mode/sound priority mode in the sound source emission mode), phone call start input, phone call end input, etc. and transfers it to the control module 470.

For the mode selection input or the preset mode, in call reception in the phone call mode, it is possible to select one among the vibration mode, the sound priority mode, and the vibration-sound combination mode. In the vibration mode, the sound emission from the speaker part 412 is extremely low, vibration occurs, and the vibration intensity of the passive vibration part 414 is implemented to the greatest extent. In the sound priority mode, the sound emission from the speaker part 412 is implemented to the great extent, the speaker part 412 also vibrates, but the vibration intensity of the passive vibration part 414 is much smaller than that in the vibration mode. In the vibration-sound combination mode, both the vibration mode and the sound priority mode are performed. The sound emission from the speaker part 412 is implemented to the great extent, and the vibration intensity of the passive vibration part 414 is identical or similar to that in the vibration mode.

In the sound source emission mode, the sound priority mode is basically implemented. The sound priority mode is identical to the sound priority mode in the aforementioned call reception.

The vibration combination mode in the sound source emission mode performs vibration by increasing the intensity of the vibration of the passive vibration part while sound is emitted in the sound priority mode, is substantially identical to the vibration-sound combination mode in call reception, and may be referred to as the vibration-sound combination mode.

The control module 470 includes at least one data processor (for example, a microprocessor, CPU etc.) to process data, signals, external sound and user inputs to control the aforementioned components.

First, in order to perform the sound source emission mode, the control module 470 acquires encoded sound source data from the telecommunication equipment through the communication part 440. The control module 470 decodes the acquired encoded sound source data to generate an electric signal and applies the electric signal to the speaker part 412 to allow the speaker part 412 to emit sound. While performing the sound source emission mode, the control module 470 performs the vibration combination mode or the sound priority mode according to the mode selection input from the input part 420 or the prestored mode. The signal processing for this operation will be described later.

In turn, in order to perform the phone call mode, the control module 470 sequentially performs a call reception process, a call process and a call end process while maintaining a communication available state with the telecommunication equipment through the communication part 440. First, in the call reception process, the control module 470 receives a call reception signal from the telecommunication equipment through the communication part 440 and generates an electric signal according to the preset mode in call reception (one among the vibration mode, the sound priority mode and the vibration-sound combination mode). The control module 470 applies the generated electric signal to the speaker part 412.

In turn, when acquiring a phone call start input through the input part 420, the control module 470 transmits the phone call start input to the telecommunication equipment through the communication part 440, and then receives a sound signal from the telecommunication equipment through the communication part 440 and applies it to the communication part 440, and transmits a sound signal from the microphone 460 to the telecommunication equipment through the communication part 440 to perform the call process. The control module 470 performs the sound priority mode during the call process.

In addition, while performing the call process, when reception of the sound signal from the telecommunication equipment is ended or a phone call end input is acquired from the input part 420, the control module 470 performs the call end process.

Hereinafter, the process for processing the electric signal transmitted to the speaker part 412 when the control module 470 performs the sound source emission mode and the mode in call reception will now be described.

Figure 14A:
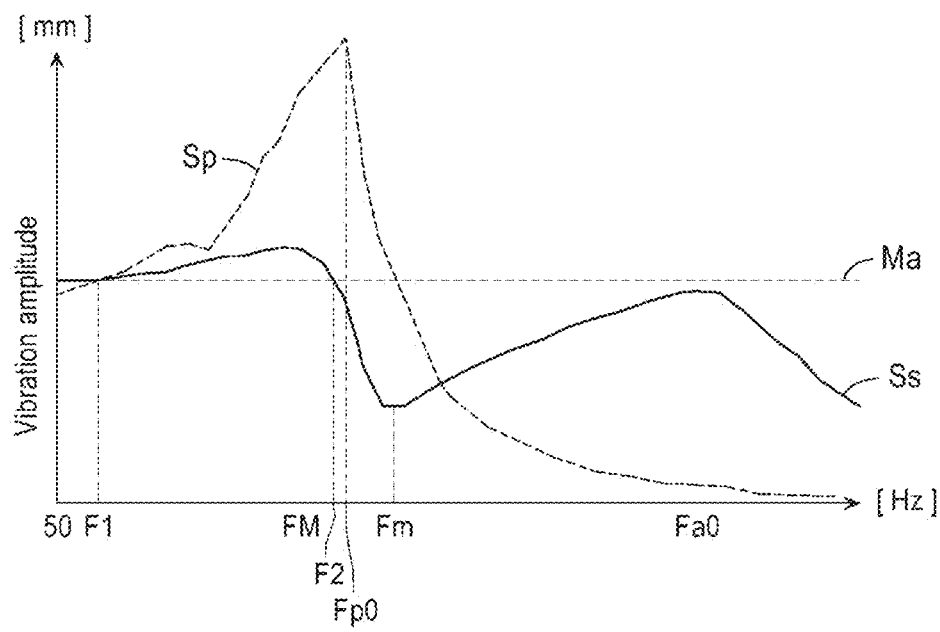
FIGS. 14A to 14C are vibration characteristic graphs and a gain correction graph of a speaker part and a passive vibration part in a speaker module of the wearable acoustic transducer of FIG. 13 in a vibration-sound combination mode.
Figure 14B:
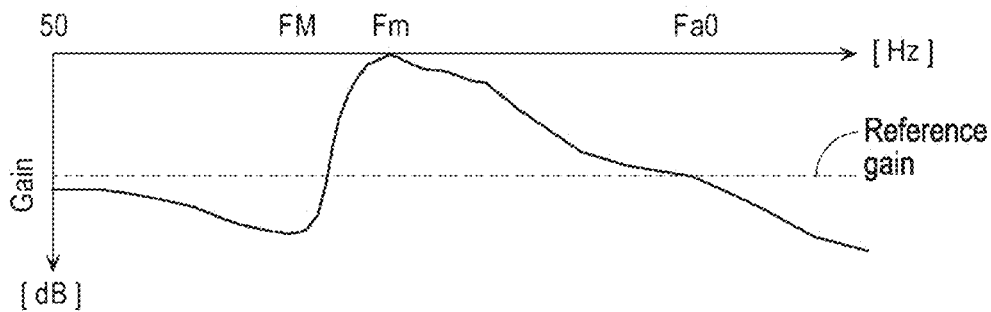
Figure 14C:
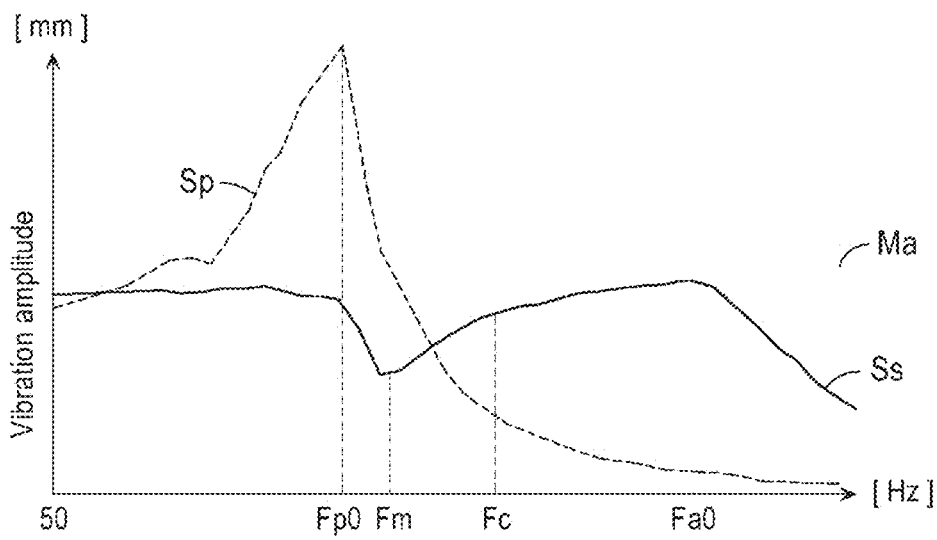

FIGS. 14A to 14C are vibration characteristic graphs and a gain correction graph of the speaker part and the passive vibration part in the speaker module of the wearable acoustic transducer of FIG. 13 in the vibration-sound combination mode.

FIG. 14A shows the vibration amplitude graphs of the diaphragm of the speaker part 412 and the diaphragm of the passive vibration part 414 in the speaker module 200 depending on the frequency of the electric signal applied to the speaker part 412. Here, graph Ss relates to the speaker part 412 and graph Sp relates to the passive vibration part 414.

In the vibration amplitude graph Ss of the speaker part 412, a natural frequency Fa0 of the speaker part 412 ranges from 400 Hz to 550 Hz, for example, and in the vibration amplitude graph Sp of the passive vibration part 414, a natural frequency Fp0 of the passive vibration part 414 ranges from 110 Hz to 140 Hz, for example.

When only the speaker part 412 is mounted in the speaker module 400, the vibration amplitude of the diaphragm of the speaker part 412 (diaphragm) in the speaker module 400 becomes the maximum in the natural frequency Fa0. That is, the speaker part 412 has one vibration amplitude maximum value (maximum value) in the natural frequency Fa0. In addition, the position, material or the like of the diaphragm is determined such that the vibration amplitude extremal value (maximum value) of the diaphragm of the speaker part 412 is maintained within the preset maximum allowable displacement Ma, regardless of the frequency of the electric signal applied by the control module 470, which prevents damages of the diaphragm or other components. Moreover, the vibration amplitude of the passive vibration part 414 becomes the maximum in the natural frequency Fp0. That is, the passive vibration part 414 has one vibration amplitude extremal value (maximum value) in the natural frequency Fp0.

When the passive vibration part 414 is also mounted in the speaker module 400 in which the vibration amplitude extremal value (maximum value) of the speaker part 412 is maintained within the maximum allowable displacement Ma, as shown in graph Ss of FIG. 14A, the vibration amplitude of the speaker part 412 may exceed the maximum allowable displacement Ma in frequencies F1 to F2 due to the vibration of the passive vibration part 414. That is, the speaker part 412 mounted in the enclosure 10*a* with the passive vibration part 414 vibrates with at least two vibration amplitude extremal values (maximum values). A frequency FM causing a first vibration amplitude extremal value (first maximum value) of the speaker part 412 exists in a lower frequency range than the natural frequency Fp0 of the passive vibration part 414, and the vibration amplitude of the passive vibration part 414 becomes the maximum in the natural frequency Fp0 of the passive vibration part 414. In addition, a second vibration amplitude extremal value (second maximum value) of the speaker part 412 is caused in the natural frequency Fa0 of the speaker part 412. Further, a first minimum value of the speaker part 412 is caused in a frequency Fm between the natural frequency Fp0 of the passive vibration part 414 and the natural frequency Fa0 of the speaker part 412.

As shown in FIG. 14A, in the frequency range between the frequency F1 and the frequency F2 including the frequency FM causing the first vibration amplitude extremal value, the vibration amplitude of the speaker part 412 exceeds the maximum allowable displacement Ma. Accordingly, the control module 470 preferably prevents damages of the speaker part 412 by decreasing the vibration amplitude of the speaker part 412 in the frequency range between the frequency F1 and the frequency F2 that exceeds the maximum allowable displacement Ma.

Also in the frequency range having a much smaller vibration amplitude than the maximum allowable displacement Ma, it is preferable to increase the vibration amplitude to secure vibration power of the passive vibration part 414 and low sound of the speaker part 412. For example, it is necessary to increase the vibration amplitude in the frequency range close to the frequency Fm corresponding to the minimum value of the speaker part 412 or in the frequency range between the frequency Fp0 and the frequency Fa0.

FIG. 14B is a graph showing gain correction data by frequencies of the control module 470. The gain correction data causes the gain to be attenuated at least in the frequency range between the frequency F1 and the frequency F2 (first gain attenuation section) and causes the gain to be increased in the frequency range close to the frequency Fm corresponding to the minimum value of the speaker part 412 or in the frequency range between the frequency Fp0 and the frequency Fa0 (gain increase section). The gain correction will be described later in more detail.

First, in the frequency range below the frequency F1, since the vibration amplitude of the speaker part 412 is maintained less than the maximum allowable displacement Ma, the gain correction data causes the gain to be attenuated or maintained.

In the frequency range between the frequency F1 and the frequency F2, the gain correction data includes the first gain attenuation section. More specifically, the first gain attenuation section includes a section in which the gain attenuation magnitude (degree) increases with the increase of the frequency in the frequency range between the frequency F1 and the frequency FM and becomes the maximum in the frequency FM, and a section in which the gain attenuation magnitude (degree) decreases with the increase of the frequency in the frequency range between the frequency FM and the frequency F2 and becomes the minimum in the frequency F2. The first gain attenuation section includes gain attenuation correction causing the vibration amplitude of the speaker part 412 to be maintained close to the maximum allowable displacement Ma and within the maximum allowable displacement Ma (for example, within 5% range).

In the frequency range F2 to Fp0 between the first gain attenuation section and the gain increase section, since the vibration amplitude of the speaker part 412 is maintained close to the maximum allowable displacement Ma and within the maximum allowable displacement Ma, the gain correction data causes the gain to be increased or maintained.

In the gain increase section, the gain increase magnitude becomes the minimum at the frequency Fp0 and the frequency Fa0 and becomes the maximum between the frequency Fp0 and the frequency Fa0. For example, the gain increase magnitude becomes the maximum in the frequency Fm. In addition, the gain increase section causes the vibration amplitude of the speaker part 412 to be maintained close to the maximum allowable displacement Ma and within the maximum allowable displacement Ma in the frequency Fa0.

In the frequency range above the frequency Fa0, the gain correction data includes a second gain attenuation section.

FIG. 14C shows the vibration amplitude graphs of the diaphragm of the speaker part 412 and the diaphragm of the passive vibration part 414 in the speaker module 400 depending on the gain-increased or attenuated electric signal according to the gain correction data of FIG. 14B. The control module 470 processes the electric signal applied to the speaker module 400 according to the stored gain correction data, such that the vibration amplitude of the speaker part 412 is maintained close to the maximum allowable displacement Ma and within the maximum allowable displacement Ma in the first gain attenuation section and the frequency range around the frequency Fa0, as shown in FIG. 14C.

Moreover, the control module 470 may store the maximum allowable displacement range (for example, from Ma−a to Ma+a) including the maximum allowable displacement Ma, instead of the maximum allowable displacement Ma which is a single value. The control module 470 stores the gain correction data causing the vibration amplitude of the speaker part 412 to be maintained within the maximum allowable displacement range, processes the electric signal according to the stored gain correction data, and applies it to the speaker part 412.

In the vibration amplitude graph Sp of the passive vibration part 414 of FIG. 14C, the vibration amplitude is significantly decreased as compared with the vibration amplitude extremal value (maximum value) in the natural frequency Fp0, and a frequency capable of minimizing the influence on the sound pressure of the speaker part 412 is determined as a cutoff frequency Fc for distinguishing between the vibration mode and the sound priority mode. In this embodiment, the frequency generating the vibration amplitude which is equal to about 15% of the vibration amplitude extremal value in the natural frequency Fp0 is determined as the cutoff frequency Fc (for example, 250 Hz).

In the gain correction data for the aforementioned vibration-sound combination mode, it is to be understood that the gain correction for the frequency range below the cutoff frequency Fc includes gain correction data for the vibration mode and the gain correction for the frequency range above the cutoff frequency Fc includes gain correction data for the sound priority mode.

Figure 15A:
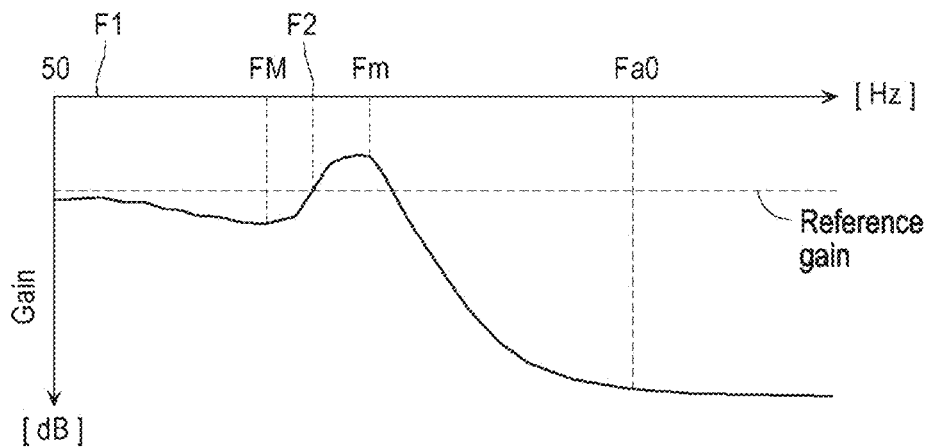
FIGS. 15A and 15B are vibration characteristic graphs and a gain correction graph of the speaker part and the passive vibration part in the speaker module of the wearable acoustic transducer of FIG. 13 in a vibration mode.
Figure 15B:
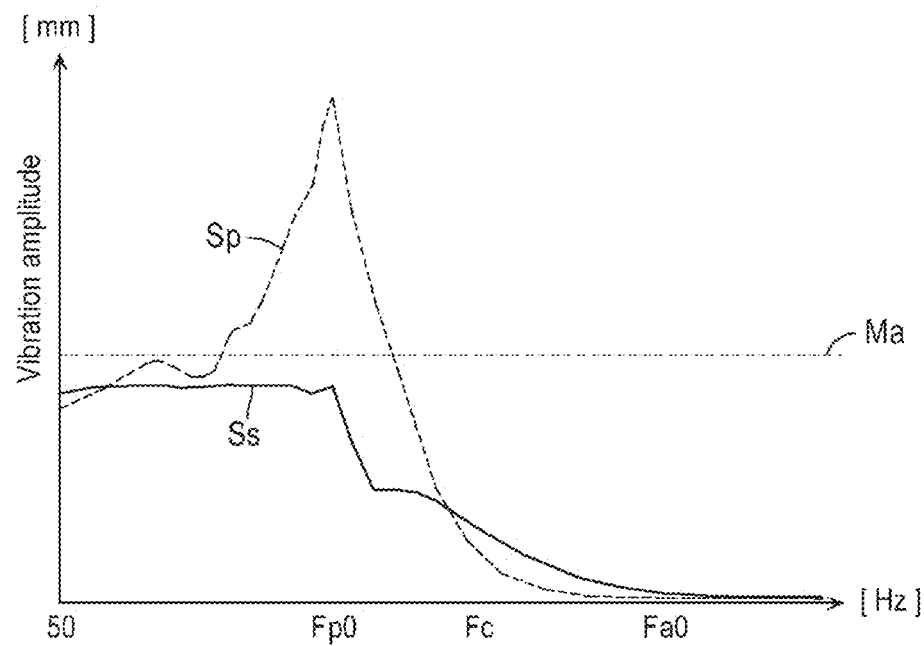

FIGS. 15A and 15B are vibration characteristic graphs and a gain correction graph of the speaker part and the passive vibration part in the speaker module of the wearable acoustic transducer in the vibration mode.

In the vibration mode, the control module 470 applies the electric signal including at least the frequency range below the cutoff frequency Fc to the speaker part 412 to emit sound.

FIG. 15A is a graph showing gain correction data by frequencies of the control module 470, The gain correction data for the vibration mode performs gain processing which is identical or substantially identical to that of FIG. 14B in a low frequency range up to the frequency Fm. In particular, the maximum gain increase correction is performed in the frequency range between the natural frequency Fp0 and the frequency Fm, such that the vibration amplitude of the passive vibration part 414 becomes the maximum.

In turn, in the frequency range between the frequency Fm and the natural frequency Fa0, the gain correction data includes a gain attenuation section in which the gain is sharply attenuated from the frequency Fm to the natural frequency Fa0 such that the maximum gain attenuation correction is performed near the natural frequency Fa0.

In the frequency range above the natural frequency Fa0, the gain correction data includes a gain attenuation section in which the maximum gain attenuation correction remains almost the same.

As described above, in the frequency range after the frequency Fm, the gain correction data includes a gain attenuation section causing sound emission through the speaker part 412 to be minimized.

FIG. 15B shows the vibration amplitude graphs of the diaphragm of the speaker part 412 and the diaphragm of the passive vibration part 414 in the speaker module 400 depending on the gain-increased or attenuated electric signal according to the gain correction data of FIG. 15A. The control module 470 processes the electric signal applied to the speaker module 400 according to the stored gain correction data, such that the vibration amplitude of the speaker part 412 is maintained within the maximum allowable displacement Ma in the first gain attenuation section, the gain increase section, and the second gain attenuation section, as shown in FIG. 15B.

Moreover, the control module 470 may store the maximum allowable displacement range (for example, Ma±a) including the maximum allowable displacement Ma, instead of the maximum allowable displacement Ma which is a single value. The control module 470 stores the gain correction data causing the vibration amplitude of the speaker part 412 to be maintained within the maximum allowable displacement range, processes the electric signal according to the stored gain correction data, and applies it to the speaker part 412.

In the vibration amplitude graph Sp of the passive vibration part 414 of FIG. 15B, the vibration amplitude is significantly decreased as compared with the vibration amplitude external value (maximum value) in the natural frequency Fp0, and a frequency capable of minimizing the influence on the sound pressure of the speaker part 412 is determined as a cutoff frequency Fc for distinguishing between the vibration mode and the sound priority mode.

Also in terms of the vibration amplitude, the vibration amplitude of the passive vibration part 414 becomes the maximum in the natural frequency Fp0, and thus the vibration quantity (vibration intensity) becomes the maximum. The vibration amplitude of the speaker part 412 is maintained close to the maximum allowable displacement Ma and within the maximum allowable displacement Ma even in the natural frequency Fp0 and sharply decreased after the natural frequency Fp0.

Figure 16A:
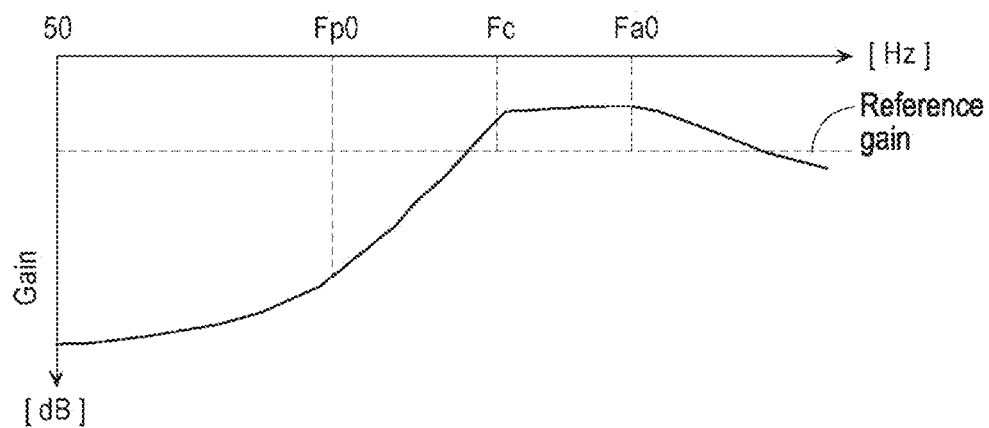
FIGS. 16A and 16B are vibration characteristic graphs and a gain correction graph of the speaker part and the passive vibration part in the speaker module of the wearable acoustic transducer of FIG. 13 in a sound priority mode.
Figure 16B:
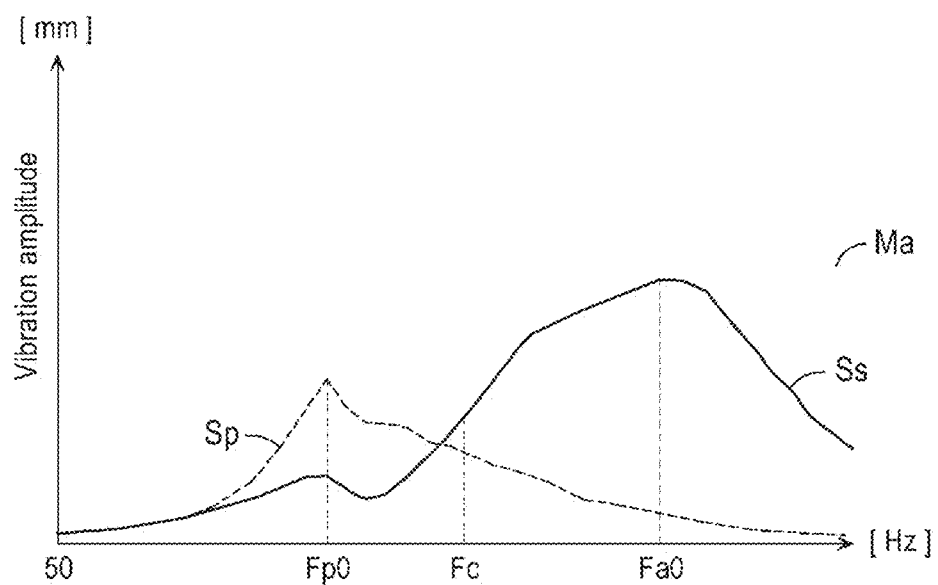

FIGS. 16A and 16B are vibration characteristic graphs and a gain correction graph of the speaker part and the passive vibration part in the speaker module of the wearable acoustic transducer in the sound priority mode. The call mode after call reception in the phone call mode also corresponds to the sound priority mode.

In the sound priority mode, the control module 470 applies an electric signal including at least the frequency range above the cutoff frequency Fc to the speaker part 412 to emit sound.

FIG. 16A is a graph showing gain correction data by frequencies of the control module 470. The gain correction data in the sound priority mode causes gain attenuation correction to be performed in the frequency range below the cutoff frequency Fc.

As shown, the gain correction data includes an attenuation section in which the more distant from the cutoff frequency Fc in the frequency range below the cutoff frequency Fc, the greater attenuation correction is performed in a low frequency band.

In the frequency range between the cutoff frequency Fc and the natural frequency Fa0, the gain correction data includes a maximum gain increase section causing the vibration amplitude of the speaker part 412 to be the closest to the maximum allowable displacement Ma and within the maximum allowable displacement Ma in the natural frequency Fa0, such that the sound emission function becomes the maximum.

In the frequency range after the natural frequency Fa0, the gain correction data includes an attenuation section in which the gain is gradually attenuated.

FIG. 16B shows the vibration amplitude graphs of the diaphragm of the speaker part 412 and the diaphragm of the passive vibration part 414 in the speaker module 400 depending on the gain-increased or attenuated electric signal according to the gain correction data of FIG. 16A. The control module 470 processes the electric signal applied to the speaker module 400 according to the stored gain correction data, such that the vibration amplitude of the speaker part 412 becomes the maximum in the frequency range near the natural frequency Fa0, and the vibration amplitudes of the speaker part 412 and the passive vibration part 414 are considerably small in the frequency range before the cutoff frequency Fc, as shown in FIG. 16B.

The control module 470 stores the aforementioned cutoff frequency Fc, the vibration characteristic of the speaker module 400 is superior to the sound emission characteristic of the speaker module 400 in the frequency range below the cutoff frequency Fc (vibration priority frequency range), and the sound emission characteristic of the speaker module 400 is superior to the vibration characteristic of the speaker module 400 in the frequency range above the cutoff frequency Fc (sound priority frequency range). In addition, both the vibration characteristic and the sound emission characteristic of the speaker module 400 are manifested in the frequency range including the frequencies below the cutoff frequency Fc and the frequencies above the cutoff frequency Fc.

The control module 470 processes the electric signal according to the gain correction data corresponding to the set mode, and then applies the processed electric signal to the speaker part 412.

In the case of the vibration mode in call reception in the phone call mode, when the control module 470 receives an incoming signal (electric signal including sound) from the communication part 440, it performs gain correction on the electric signal, which is the incoming signal, based on the gain correction data as shown in FIG. 15A and applies the gain-corrected electric signal to the speaker part 412. The gain correction data for the vibration mode has a frequency-gain characteristic in which the gain attenuation magnitude in the frequency range above the cutoff frequency Fc is larger than the gain attenuation magnitude in the frequency range below the cutoff frequency Fc. In addition, the gain correction data for the vibration mode has a frequency-gain characteristic in which the vibration amplitude is close to the maximum allowable displacement Ma or the maximum allowable displacement range and within the maximum allowable displacement Ma or the maximum allowable displacement range, in the frequency range from F1 to F2 causing the vibration amplitude exceeding the maximum allowable displacement Ma or the maximum allowable displacement range of the vibration amplitude.

Alternatively, in the case of the vibration mode in call reception in the phone call mode, when the control module 470 receives an incoming signal (electric signal not including sound) from the communication part 440, since the vibration characteristic needs to be superior to the sound emission characteristic, it generates an electric signal, which includes a vibration propriety frequency range as a relatively large gain and a sound propriety frequency range as a relatively small gain, and applies the electric signal to the speaker part 412. That is, the control module 470 generates an electric signal (vibration electric signal) having a frequency-voltage magnitude corresponding to the frequency-gain characteristic of the gain correction data as shown in FIG. 15B and applies it to the speaker part 412.

Further, in the case of the sound priority mode in call reception in the phone call mode or of the sound priority mode in the sound source emission mode, when the control module 470 receives an incoming signal (electric signal including sound or voice) from the communication part 440, it performs gain correction on the electric signal, which is the incoming signal, based on the gain correction data as shown in FIG. 16A and applies the gain-corrected electric signal to the speaker part 412. The gain correction data for the sound priority mode has a frequency-gain characteristic in which the gain attenuation magnitude in the frequency range below the cutoff frequency Fc is larger than the gain attenuation magnitude in the frequency range above the cutoff frequency Fc. In addition, the gain correction data for the sound priority mode performs at least gain increase correction between the cutoff frequency Fc and the natural frequency Fa0 of the speaker part 412, such that the vibration amplitude (maximum value) of the speaker part 412 is close to the maximum allowable displacement Ma or the maximum allowable displacement range and within the maximum allowable displacement Ma or the maximum allowable displacement range of the vibration amplitude.

Furthermore, in the case of the vibration combination mode in the sound source emission mode (concurrent or sequential occurrence of the vibration mode and the sound priority mode), the control module 470 performs gain attenuation correction on the electric signal in the frequency range from F1 to F2 that includes a frequency causing the first vibration amplitude maximum value in the frequency range below the cutoff frequency Fc and that causes a vibration amplitude exceeding the maximum allowable displacement or the maximum allowable displacement range of the vibration amplitude, as in the correction data of FIG. 14B, such that the vibration amplitude of the speaker part 412 is close to the maximum allowable displacement or the maximum allowable displacement range and within the maximum allowable displacement or the maximum allowable displacement range of the vibration amplitude, and performs at least gain increase correction between the cutoff frequency Fc and the natural frequency Fa0 of the speaker part 412, such that the vibration amplitude of the speaker part 412 is close to the maximum allowable displacement Ma or the maximum allowable displacement range and within the maximum allowable displacement Ma or the maximum allowable displacement range of the vibration amplitude. As discussed earlier, the control module 470 performs gain correction on the electric signal received from the communication part 440 according to the gain correction data for the vibration-sound combination mode and applies it to the speaker part 412.

Also, in the case of the vibration-sound combination mode in call reception in the phone call mode, the control module 470 receives an incoming signal (electric signal including sound or voice) from the communication part 440 and processes it in the following two methods.

First, the control module 470 performs gain correction on the received electric signal as in the vibration combination mode in the sound source emission mode described above and applies the gain-corrected electric signal to the speaker part 412.

In another way, the control module 470 generates an electric signal (vibration electric signal) having a frequency-voltage magnitude corresponding to the frequency-gain characteristic of the gain correction data for the vibration mode in FIG. 15A, as in the vibration mode in call reception in the phone call mode described above, while performing the sound priority mode in call reception in the phone call mode described above, and applies the electric signal to the speaker part 412.

In addition, the control module 470 performs the vibration mode or the vibration-sound combination mode in call reception in the phone call mode, and ends the vibration mode or the vibration-sound combination mode and performs the sound priority mode from the start of the phone call.

Moreover, the control module 470 may perform any one of the vibration mode, the sound mode and the vibration-sound combination mode according to the incoming signal in the phone call mode, while performing the sound source emission mode. That is, the control module 470 performs any one of the vibration mode, the sound mode and the vibration-sound combination mode according to the incoming signal in the phone call mode, while receiving sound source data from the telecommunication equipment and continuously performing the sound source emission mode.

Figure 17:
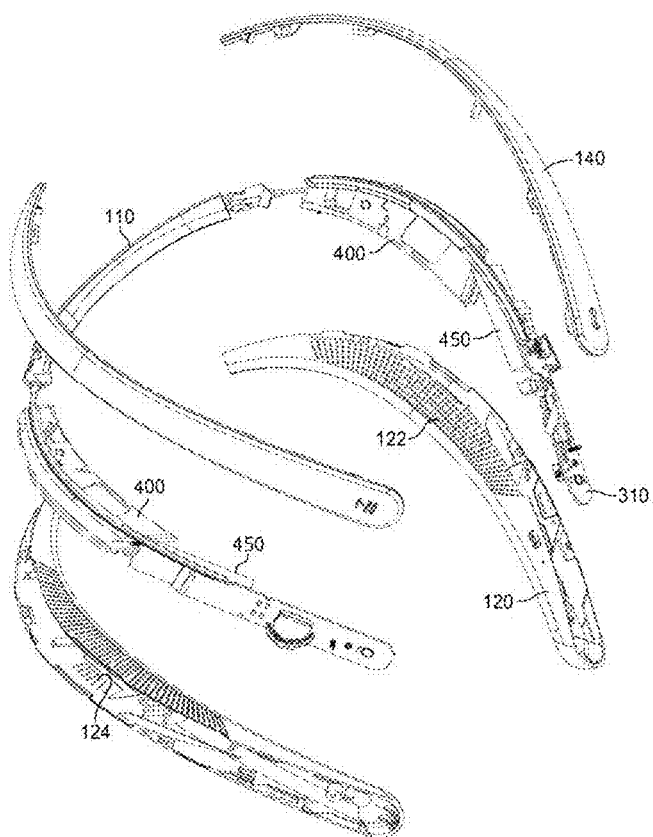
FIG. 17 is an exploded perspective view of the wearable acoustic transducer of FIG. 13.

FIG. 17 is an exploded perspective view of the wearable acoustic transducer of FIG. 13. The wearable acoustic transducer according to the present invention includes a C-shaped frame that can be worn around a user's neck, wherein various electric components such as a speaker module 400 and a PCB 310 are disposed in the frame. The frame includes a C-shaped base frame 110, and an inner cover 120 and an outer cover 140 coupled to the base frame 110.

One speaker module 400, one PCB 310 and one power supply 450 are disposed at each of both ends of the C-shaped base frame 110. The inner cover 120 covers the electric components and the bottom surface, inner surface and top surface of the C-shaped frame 110, while the outer cover 140 is coupled to the inner cover 120 to cover the electric components and the outer surface of the C-shaped frame 110.

A sound emitting hole 122 for emitting the sound generated from the microspeaker module 400 is formed in the top surface of the inner cover 120, and a vent hole 124 for facilitating an air flow is formed in the bottom surface thereof.

Further, an input part 420, a display part 430, a communication part 440 and a microphone 460 are mounted on at least one PCB 310.

Figure 18:
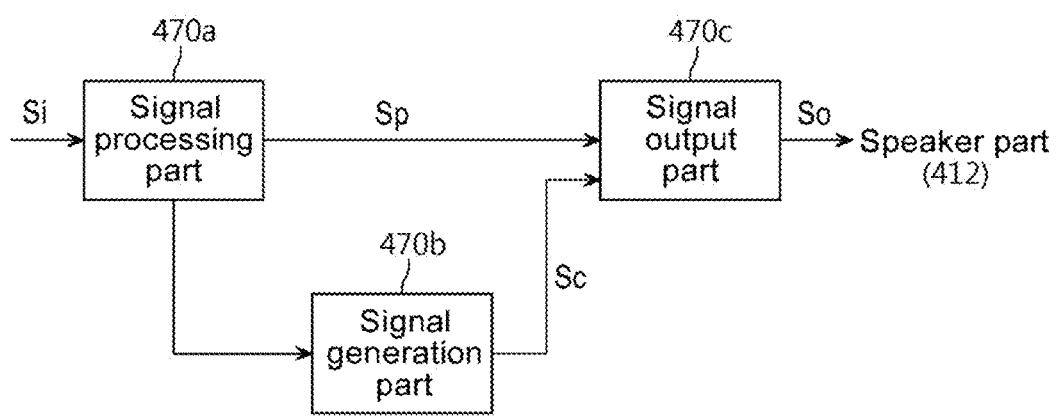
FIG. 18 shows one embodiment of a control module of FIG. 13.

FIG. 18 shows one embodiment of the control module of FIG. 13.

The control module 470 includes a signal processing part 470a for receiving an input signal Si, performing gain correction on the input signal Si according to the set mode, and applying an electric signal Sp to a signal output part 470c or applying a signal generation command to a signal generation part 470b, the signal generation part 470b for receiving the signal generation command from the signal processing part 470a and generating a vibration electric signal Sc including a vibration priority frequency range, and the signal output part 470c for outputting at least one of the electric signal Sp from the signal processing part 470a and the vibration electric signal Sc from the signal generation part 470b to the speaker part 412 as an output signal So.

The signal processing part 470a, the signal generation part 470b and the signal output part 470c may be implemented by a program or application stored in a data processor, memory, or the like.

Meanwhile, in the vibration mode in call reception in the phone call mode, the signal processing part 470a receives the incoming signal, which is the input signal Si, and applies the signal generation command to the signal generation part 470b to generate the vibration electric signal. The signal generation part 470b generates the vibration electric signal Sc according to the signal generation command and applies it to the signal output part 470c, and the signal output part 470c applies the received vibration electric signal Sc to the speaker part 412 as the output signal So to perform the vibration mode.

In addition, in the vibration-sound combination mode in call reception in the phone call mode, the signal processing part 470a receives the incoming signal, which is the input signal Si, applies the signal generation command to the signal generation part 470b to generate the vibration electric signal, performs correction on the sound signal included in the input signal Si according to the gain correction data, generates the electric signal Sp including the sound priority frequency range and applies it to the signal output part 470c. However, the signal processing part 470a may perform only gain correction on the sound signal included in the input signal Si, generate the electric signal Sp, and apply it to the signal output part 470c. When the sound signal included in the input signal Si is an encoded signal, a decoding process may be performed before the gain correction process. The signal generation part 470b generates the vibration electric signal Sc according to the signal generation command and applies it to the signal output part 470c, and the signal output part 470c combines the received vibration electric signal Sc and electric signal Sp and applies the combined signal to the speaker part 412 as the output signal So to perform the vibration-sound combination mode.

Also, in the vibration combination mode in the sound source emission mode, the signal processing part 470a receives the input signal Si, which is a sound source or sound signal, from the communication part 440, decodes the input signal Si, performs correction on the decoded input signal Si according to the gain correction data for the vibration-sound combination mode, generates the electric signal Sp, and applies it to the signal output part 470c. Alternatively, the signal processing part 470a may apply the signal generation command to the signal generation part 470b to generate the electric signal including only the vibration priority frequency range and may perform the sound priority mode causing the sound electric signal Sp to include only the sound priority frequency range in generation of the electric signal Sp. The signal generation part 470b generates the vibration electric signal Sc including only the vibration priority frequency range according to the signal generation command and applies it to the signal output part 470c, and the signal output part 470c combines the received electric signal Sp and vibration electric signal Sc and applies the combined signal to the speaker part 412 as the output signal So to perform the vibration combination mode.

Moreover, in the case of the sound priority mode in the phone call mode, the signal processing part 470a performs correction on the input signal Si received through the communication part 440 according to the gain correction data for the sound priority mode, generates the electric signal Sp, and applies it to the signal output part 470c. The signal output part 470c receives the electric signal Sp and applies it to the speaker part S as the output signal So.

Further, in the case of the sound priority mode in the sound source emission mode, the signal processing part 470a receives the input signal Si, which is a sound source or sound signal, from the communication part 440, decodes the input signal Si, performs correction on the decoded input signal Si according to the gain correction data for the sound priority mode, generates the electric signal Sp, and applies it to the signal output part 470c. The signal output part 470c applies the received electric signal Si to the speaker part S as the output signal So to perform the sound priority mode.

Furthermore, the signal processing part 470a performs the vibration mode or the vibration-sound combination mode in call reception in the phone call mode, applies a signal generation end command to the signal generation part 470b to end the vibration mode or the vibration-sound combination mode from the start of the phone call, performs correction on the input signal Si including sound or voice that is input from the communication part 440 according to the gain correction data for the sound priority mode, generates the electric signal Sp, and applies it to the signal output part 470c. The signal generation part 470b ends the generation and application of the vibration electric signal Sc according to the signal generation end command, and the signal output part 470c applies the received electric signal Sp to the speaker part S as the output signal So to perform the sound mode.

The acoustic transducer may download an application APP for performing the gain correction process according to the gain correction data, the process for generating the vibration electric signal, and the process for performing the vibration mode, the sound priority mode and the vibration-sound combination mode (vibration combination mode) from the server for the downloading and uploading of the application, and install and execute the application. In addition, the program for performing the gain correction process, the process for generating the vibration electric signal, and the process for performing the vibration mode, the sound priority mode and the vibration-sound combination mode of the present invention may be provided in the form of a storage medium for storing a computer readable program other than the application.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A wearable acoustic transducer, comprising:
   a communication part configured to perform communication with a telecommunication equipment;
   a speaker module including an enclosure having an inner space, a first opening in which a speaker part is mounted being formed in a first side surface thereof, a second opening in which a passive vibration part is mounted being formed in a second side surface thereof, the speaker part configured to emit sound, and a passive vibration part configured to relieve air stiffness in the inner space of the enclosure; and
   a control module configured to perform gain correction on an electric signal including sound or voice that is received from the communication part according to prestored gain correction data to generate a gain-corrected electric signal and apply the gain-corrected electric signal to the speaker part, or to generate an electric signal corresponding to the gain correction data and apply the electric signal to the speaker part,
   wherein a natural frequency of the speaker part is higher than a natural frequency of the passive vibration part,
   wherein the control module stores a cutoff frequency between the natural frequency of the passive vibration part and the natural frequency of the speaker part,
   wherein the control module is configured to perform a vibration mode,
   wherein, when the control module performs the vibration mode, the control module is configured to apply an electric signal to the speaker part, in which electric signal a gain attenuation magnitude in a frequency range above the cutoff frequency becomes larger than a gain attenuation magnitude in a frequency range below the cutoff frequency according to the gain correction data for the vibration mode.

2. The wearable acoustic transducer of claim 1, wherein a natural frequency of the speaker part is higher than a natural frequency of the passive vibration part, and wherein the speaker part mounted in the enclosure is configured to vibrate with a first vibration amplitude maximum value in a frequency lower than the natural frequency of the passive vibration part and with a second vibration amplitude maximum value in the natural frequency of the speaker part.

3. The wearable acoustic transducer of claim 2, wherein the control module is configured to process the received electric signal according to the gain correction data causing the vibration amplitude of the speaker part to be within the maximum allowable displacement or the maximum allowable displacement range of the vibration amplitude.

4. The wearable acoustic transducer of claim 2, wherein the control module is configured to perform gain attenuation correction on an electric signal in a frequency range that includes a frequency causing the first vibration amplitude maximum value and that causes a vibration amplitude exceeding the maximum allowable displacement or the maximum allowable displacement range of the vibration amplitude, according to the gain correction data.

5. The wearable acoustic transducer of claim 4, wherein the control module is configured to attenuate more gain in a frequency approaching the frequency causing the first vibration amplitude maximum value.

6. The wearable acoustic transducer of claim 4, wherein the control module is configured to perform gain increase correction on the electric signal from the frequency range including a vibration amplitude minimum value between the first vibration amplitude maximum value and the second vibration amplitude maximum value to the natural frequency of the speaker part according to the gain correction data.

7. The wearable acoustic transducer of claim 4, wherein the control module is configured to perform gain attenuation correction in a frequency range above the natural frequency of the speaker part according to the gain correction data.

8. The wearable acoustic transducer of claim 1, wherein the control module is configured to perform one or more of a sound priority mode and a vibration-sound combination mode including the vibration mode and the sound priority mode.

9. The wearable acoustic transducer of claim 1, wherein in the vibration mode, the control module is configured to perform gain attenuation correction on an electric signal in a frequency range that includes a frequency causing the first vibration amplitude maximum value and that causes a vibration amplitude exceeding the maximum allowable displacement or the maximum allowable displacement range of the vibration amplitude according to the gain correction data for the vibration mode, such that a vibration amplitude of the speaker part is close to the maximum allowable displacement or the maximum allowable displacement range and within the maximum allowable displacement or the maximum allowable displacement range of the vibration amplitude.

10. The wearable acoustic transducer of claim 8, wherein in the sound priority mode, the control module performs gain correction on the received electric signal according to the gain correction data for the sound priority mode, such that a gain attenuation magnitude in a frequency range below the cutoff frequency becomes larger than a gain attenuation magnitude in a frequency range above the cutoff frequency, and applies the electric signal to the speaker part.

11. The wearable acoustic transducer of claim 10, wherein, when the control module performs the sound priority mode, the control module is configured to perform at least gain increase correction between the cutoff frequency and the natural frequency of the speaker part according to the gain correction data for the sound priority mode, such that the vibration amplitude of the speaker part is close to the maximum allowable displacement or the maximum allowable displacement range and within the maximum allowable displacement or the maximum allowable displacement range of the vibration amplitude.

12. The wearable acoustic transducer of claim 8, wherein in the vibration-sound combination mode, the control module is configured to perform gain attenuation correction on the electric signal in a frequency range that includes a frequency causing the first vibration amplitude maximum value in a frequency range below the cutoff frequency and that causes a vibration amplitude exceeding the maximum allowable displacement or the maximum allowable displacement range of the vibration amplitude according to the gain correction data for the vibration-sound combination mode, such that the vibration amplitude of the speaker part is close to the maximum allowable displacement or the maximum allowable displacement range and within the maximum allowable displacement or the maximum allowable displacement range of the vibration amplitude, and perform at least gain increase correction between the cutoff frequency and the natural frequency of the speaker part, such that the vibration amplitude of the speaker part is close to the maximum allowable displacement or the maximum allowable displacement range and within the maximum allowable displacement or the maximum allowable displacement range of the vibration amplitude.

13. The wearable acoustic transducer of claim 1, wherein the control module comprises:
a signal processing part configured to perform gain correction on the received electric signal according to the gain correction data for a set mode and apply the electric signal to a signal output part or apply a signal generation command or a signal generation end command to a signal generation part,
wherein the signal generation part is configured to receive the signal generation command from the signal processing part, generate a vibration electric signal and apply the vibration electric signal to the signal output part, or receive the signal generation end command from the signal processing part and end the generation and application of the vibration electric signal; and
wherein the signal output part is configured to output at least one of the electric signal from the signal processing part and the vibration electric signal from the signal generation part to the speaker part as an output signal.

14. A wearable acoustic transducer, comprising:
a communication part configured to perform communication with a telecommunication equipment;
a speaker module including an enclosure having an inner space, a first opening in which a speaker part is mounted being formed in a first side surface thereof, a second opening in which a passive vibration part is mounted being formed in a second side surface thereof, the speaker part configured to emit sound, and a passive vibration part configured to relieve air stiffness in the inner space of the enclosure; and
a control module configured to perform gain correction on an electric signal including sound or voice that is received from the communication part according to prestored gain correction data to generate a gain-corrected electric signal and apply the gain-corrected electric signal to the speaker part, or to generate an electric signal corresponding to the gain correction data and apply the electric signal to the speaker part,
wherein the control module comprises:
a signal processing part configured to perform gain correction on the received electric signal according to the gain correction data for a set mode and apply the electric signal to a signal output part or apply a signal generation command or a signal generation end command to a signal generation part,
wherein the signal generation part is configured to receive the signal generation command from the signal processing part, generate a vibration electric signal and apply the vibration electric signal to the signal output part, or receive the signal generation end command from the signal processing part and end the generation and application of the vibration electric signal; and
wherein the signal output part is configured to output at least one of the electric signal from the signal processing part and the vibration electric signal from the signal generation part to the speaker part as an output signal.

* * * * *